United States Patent
Polyakov et al.

(10) Patent No.: US 10,872,939 B2
(45) Date of Patent: Dec. 22, 2020

(54) VIEWING ANGLE COLOR SHIFT CONTROL

(71) Applicant: Apple Inc., Cupertino, CA (US)

(72) Inventors: Aleksandr N. Polyakov, San Jose, CA (US); Meng-Huan Ho, Hsinchu (TW); Yi Huang, San Jose, CA (US); Yi Qiao, San Jose, CA (US); David S. Hum, Sunnyvale, CA (US); Jean-Pierre S. Guillou, Los Gatos, CA (US); Yanming Li, San Jose, CA (US); Jun Qi, San Jose, CA (US); KiBeom Kim, Cupertino, CA (US); Kwang Ohk Cheon, San Jose, CA (US); Cheng Chen, San Jose, CA (US); Rui Liu, San Jose, CA (US); ByoungSuk Kim, Palo Alto, CA (US); Ying-Chih Wang, Sunnyvale, CA (US); Hung Sheng Lin, San Jose, CA (US); Donghee Nam, San Jose, CA (US); Tyler R. Kakuda, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 16 days.

(21) Appl. No.: 16/216,651

(22) Filed: Dec. 11, 2018

(65) Prior Publication Data

US 2020/0075693 A1    Mar. 5, 2020

Related U.S. Application Data

(60) Provisional application No. 62/726,940, filed on Sep. 4, 2018.

(51) Int. Cl.
*H01L 51/52* (2006.01)
*G02B 5/30* (2006.01)
*G02B 5/20* (2006.01)
*H01L 27/32* (2006.01)

(52) U.S. Cl.
CPC ............ *H01L 27/3246* (2013.01); *G02B 5/20* (2013.01); *G02B 5/3016* (2013.01); *G02B 5/3025* (2013.01); *H01L 51/5262* (2013.01); *H01L 51/5293* (2013.01)

(58) Field of Classification Search
None
See application file for complete search history.

(56) References Cited

U.S. PATENT DOCUMENTS

| | | | |
|---|---|---|---|
| 7,859,521 B2 | 12/2010 | Hotelling et al. | |
| 8,243,027 B2 | 8/2012 | Hotelling et al. | |
| 9,223,065 B2 | 12/2015 | Jung et al. | |
| 9,773,847 B2 | 9/2017 | Epstein et al. | |
| 2003/0063245 A1* | 4/2003 | Bowley | G02B 5/3016 349/115 |

(Continued)

OTHER PUBLICATIONS

Hsieh, Calvin, "[Display Dynamics] Apple's force sensing patents and evolution", IHS Markit Technology, Market Insight, Jun. 23, 2017, 3 pages.

*Primary Examiner* — Michelle Mandala
*Assistant Examiner* — Jordan M Klein
(74) *Attorney, Agent, or Firm* — Jaffery Watson Mendonsa & Hamilton LLP

(57) ABSTRACT

Display structures for controlling viewing angle color shift are described. In various embodiments, polarization sensitive diffusers, independent controlled cathode thicknesses, filtermasks, and color filters are described.

15 Claims, 13 Drawing Sheets

(56) References Cited

U.S. PATENT DOCUMENTS

| | | | |
|---|---|---|---|
| 2005/0035353 A1* | 2/2005 | Adachi | H01L 51/5281 257/72 |
| 2017/0076677 A1 | 3/2017 | Lin et al. | |
| 2017/0278899 A1 | 9/2017 | Yang | |
| 2017/0278900 A1 | 9/2017 | Yang | |
| 2017/0308196 A1 | 10/2017 | Jeong et al. | |
| 2017/0324058 A1 | 11/2017 | Min | |
| 2017/0373270 A1 | 12/2017 | Kim et al. | |
| 2018/0033830 A1 | 2/2018 | Kim et al. | |
| 2018/0182819 A1 | 6/2018 | Jo et al. | |
| 2018/0188866 A1 | 7/2018 | Heo et al. | |
| 2019/0121474 A1 | 4/2019 | Lee et al. | |
| 2019/0123112 A1 | 4/2019 | Lee et al. | |
| 2019/0129551 A1 | 5/2019 | Lee et al. | |
| 2019/0129552 A1 | 5/2019 | Lee et al. | |
| 2020/0089351 A1 | 3/2020 | Jeong et al. | |

\* cited by examiner

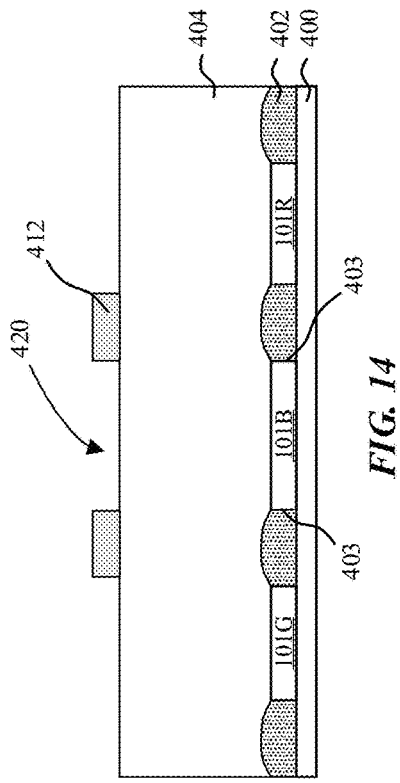
FIG. 13
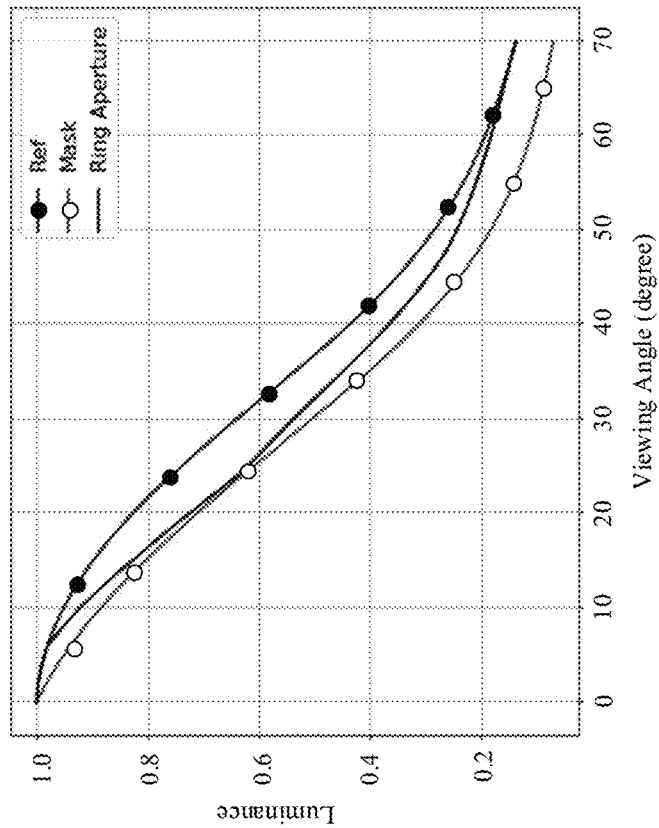
FIG. 14
FIG. 16
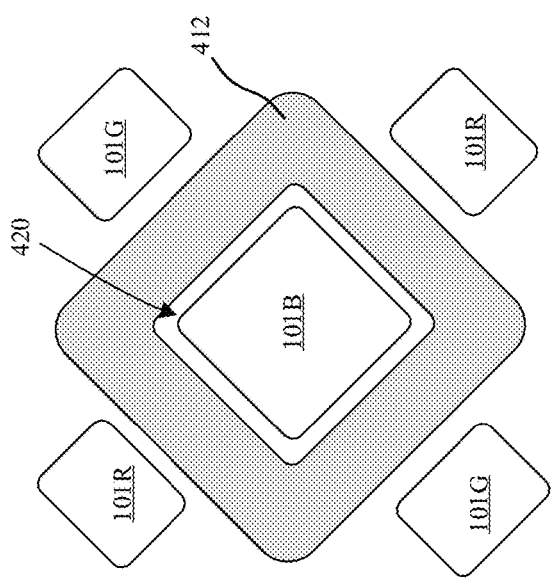
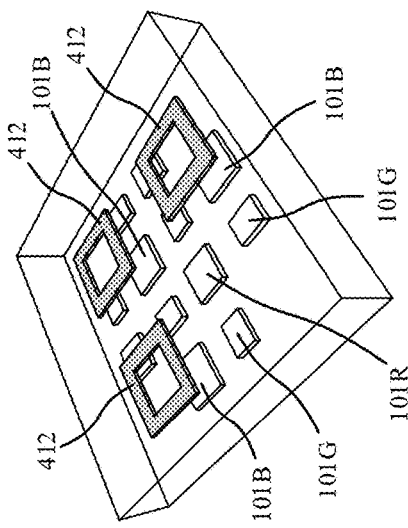
FIG. 15

VIEWING ANGLE COLOR SHIFT CONTROL

RELATED APPLICATIONS

This application claims the benefit of priority of U.S. Provisional Application No. 62/726,940 filed Sep. 4, 2018 which is incorporated herein by reference.

BACKGROUND

Field

Embodiments described herein relate to display systems. More particularly, embodiments relate to organic light emitting diode (OLED) display systems.

Background Information

State of the art displays for phones, tablets, computers and televisions utilize glass substrates with thin-film transistors (TFT) to control transmission of backlight through pixels based on liquid crystals. More recently emissive displays such as those based on organic light emitting diodes (OLED) have been introduced because they can have a faster response time, and be more power efficient, allowing each pixel to be turned off completely when displaying black or dark colors, and be compatible with plastic substrates. Generally small size OLED display panels use top emission OLED architecture with optical microcavity effect to enhance optical efficiency and narrow the emission spectra. Cavity red-green-blue (RGB) OLEDs have different angular intensity distributions which causes white color shift at different angles.

SUMMARY

Embodiments describe display and pixel structures. The specific structures described, including incorporation of polarization sensitive diffusers, subpixel cathode thickness control, various filtermask configurations, and color filters may be implemented to control reflection performance and angular performance, such as viewing angle color shift, off-angle emission intensity, off-angle color bias, and color point drift.

In an embodiment, a display structure includes an emissive light emitting diode (LED), a polarization sensitive diffuser layer over the LED, a quarterwave film adjacent the polarization sensitive diffuser, and a linear polarization film over the polarization sensitive diffuser layer and the quarterwave film. The quarterwave film may be located over the polarization sensitive diffuser layer or underneath the polarization sensitive diffuser layer. In an embodiment, the polarization sensitive diffuser layer includes a liquid crystal polymer film underneath an isotropic film, in which the liquid crystal polymer film includes a top surface characterized by a higher average surface roughness than a top surface of the isotropic film. In an embodiment, polarization sensitive diffuser layer comprises liquid crystals dispersed in an isotropic film.

A display pixel in accordance with an embodiment may include a first subpixel emission layer designed to emit a first wavelength spectrum, a second subpixel emission layer designed to emit a second wavelength spectrum different from the first wavelength spectrum, a first cathode layer area on the first subpixel emission layer, and a second cathode layer area on the second subpixel emission layer. In such an embodiment, the second cathode layer area may be thicker than the first cathode layer area. The first cathode layer area and the second cathode layer area may be portions of a common cathode layer. In an embodiment, an organic layer is located over the first cathode layer area and the second cathode layer area, where the organic layer is thicker over the first cathode layer area than over the second cathode layer area.

A display pixel in accordance with an embodiment may include a first LED, a second LED, a passivation layer over the first LED and the second LED, and a filtermask over the passivation layer. In such an embodiment, the filtermask may be ring shaped and include an aperture over the first LED. The ring shaped filtermask may include an outer perimeter characterized by a contour such as oval or rectangular. In an embodiment, the ring shaped filtermask includes an outer perimeter characterized by a same shape as the aperture. A second filtermask may be located between the filtermask layer and the passivation layer, with the second filtermask including a second aperture over the first LED. In an embodiment, the second aperture is wider than the first aperture. In an exemplary implementation, the filtermask includes a longpass filter, and the second filtermask includes a second longpass filter. The longpass filter and the second longpass filter may be designed to pass the same or portion of the same spectrum. In one implementation a shortpass filter layer is located over the second LED.

A display pixel in accordance with an embodiment may include a first LED, a second LED, a passivation layer over the first LED and the second LED, a filtermask over the passivation layer, the filtermask including an aperture over the first LED. In such an embodiment the filtermask may completely cover the second LED. The filtermask may include a material such as a band-pass filter or a black matrix material. For example, the band-pass filter may be a longpass filter.

A display pixel in accordance with an embodiment may include a pixel defining layer (PDL) including a first subpixel opening and a second subpixel opening, a passivation layer over the PDL, and a filtermask over the passivation layer, the filtermask including a first aperture over the first subpixel opening and a second aperture over the second subpixel opening. In such an embodiment, the first aperture may be wider than the first subpixel opening by a first minimum gap, and the second aperture may be wider than the second subpixel opening by a second minimum gap distance, where the second minimum gap distance is greater than the first minimum gap distance. A first color filter may be located adjacent the first aperture, and a second color filter located adjacent the second aperture. In an embodiment, the first color filter includes a first concave bottom surface, and the second color filter includes a second concave bottom surface.

BRIEF DESCRIPTION OF THE DRAWINGS

FIG. 13 is a schematic top view illustration of a ring shaped filtermask over a subpixel in accordance with an embodiment.

FIG. 14 is a schematic cross-sectional side view illustration of a ring shaped filtermask over a subpixel in accordance with an embodiment.

FIG. 15 is a schematic isometric view illustration of a plurality of ring shaped filtermask over a plurality of subpixels in accordance with an embodiment.

FIG. 16 is a plot of luminance over viewing angle in accordance with embodiments.

DETAILED DESCRIPTION

Figure 1:
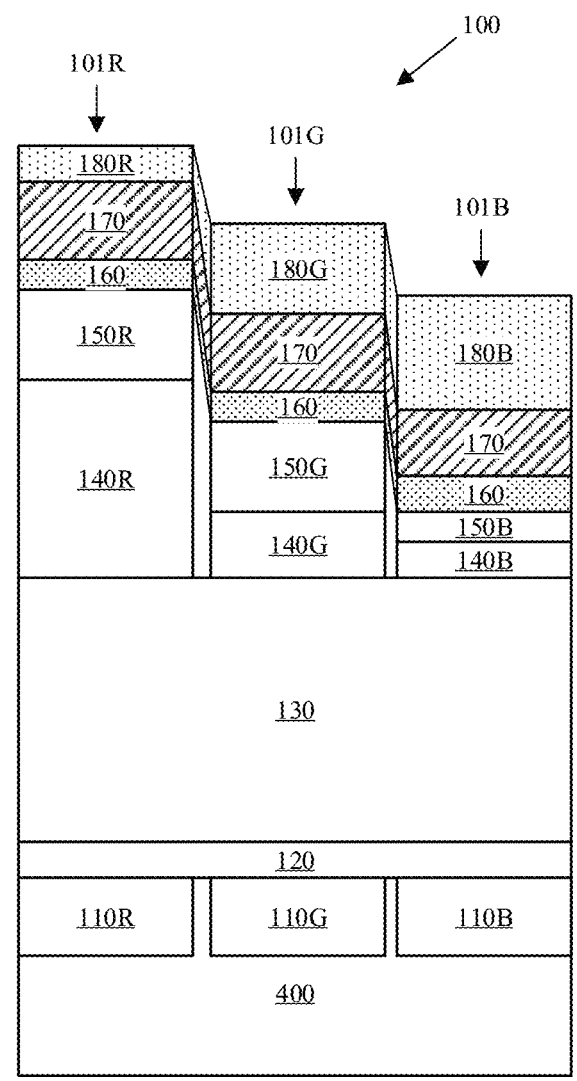
FIG. 1 is a schematic cross-sectional side view illustration of a display pixel with different cathode layer thicknesses for respective subpixels in accordance with an embodiment.

Embodiments describe various display and pixel structures to control reflection performance and angular performance, such as viewing angle color shift, off-angle emission intensity, off-angle color bias, and color point drift.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", and "on" as used herein may refer to a relative position of one layer with respect to other layers. One layer "over", or "on" another layer or bonded "to" or in "contact" with another layer may be directly in contact with the other layer or may have one or more intervening layers. One layer "between" layers may be directly in contact with the layers or may have one or more intervening layers.

In an embodiment, a display structure includes a polarization sensitive diffuser layer behind a front polarizer. In such a configuration, incoming ambient light is polarized after passing through the front polarizer. The polarization sensitive diffuser layer is designed to be transparent to the incoming polarized light and diffuse internally reflected light as well as light emitted from the emissive LED beneath the polarization sensitive diffuser layer. In this manner reflection performance and angular performance of the display structure may be improved.

In an embodiment, a display pixel includes one or more filtermask layers. For example, the filtermasks may be longpass filtermasks, shortpass filtermasks, or a black matrix. Aperture size and shape of the filtermasks can be tuned to adjust off-angle emission intensity, off-angle color bias, and color point drift. In one configuration, the filtermask is a fully obstructing mask, in which the apertures are provided over one subpixel, and cover another subpixel. In one configuration, the filtermask is ring shaped, so as to be subpixel specific. Multiple layer structures are additionally described in which a number of combinations of filtermask layers are possible.

In some embodiments, off axis color can be tuned by adjusting the cavity effect of an emissive LED structure using techniques such as adjusting independent subpixel cathode thickness, and the inclusion of patterned reflectors. In some embodiments, off axis color can be tuned by adjusting the size and curvature of a color filter. It is to be appreciated that while embodiments are described and illustrated separately, that many embodiments described herein may be combined.

Referring now to FIG. 1 a schematic cross-sectional side view illustration is provided of a display pixel with different cathode layer thicknesses for respective subpixels in accordance with an embodiment. Independent control of cathode thicknesses is expected to provide additional control of off-angle color and luminance due to cavity effect. In accordance with embodiments, independent control of cathode thickness may be implemented to match the luminance distributions for each subpixel, allowing for a reduction in white off-angle color shift and providing better viewing angle performance while also increasing on-axis efficiency and lowering panel power. In the particular embodiment illustrated, an RBG pixel 100 is shown with a red LED 101R, green LED 101G, and blue LED 101B. An RGB pixel 100 arrangement is exemplary and embodiments are no so limited. Other exemplary pixel arrangements include red-green-blue-yellow-cyan (RBGYC), red-green-blue-white (RGBW), or other subpixel matrix schemes where the pixels have a different number of subpixels.

As shown, a display pixel 100 structure may include anodes 110R, 110G, 110B, a hole injection layer (HIL) 120 on/over the anodes 110R, 110G, 110B, and a hole transport layer (HTL) 130 on/over the HIL 120. In some embodiments, HIL 120 and HTL 130 may be common layers for the subpixels. Alternatively, these layers may be subpixel specific. In the particular embodiment illustrated, specific prime layers 140R, 140G, 140B are formed for each subpixel. The prime layers may have different thicknesses to control the cavity effect. An emission layer 150R, 150G, 150G is formed over each specific prime layer. Hole blocking layers (HBL) 160R, 160G, 160B may be formed over the emission layers, with electron injections layers (EIL) and electron transport layers (ETL), which may be separate layers or the same layer, 170R, 170G, 170B formed over the specific HBLs. As illustrated, separate cathode layers 180R, 180G, 180B are formed over the EILs/ETLs 170R, 170G, 170B.

As described and illustrated herein a layer on/over another layer may be directly on (in contact) with the other layer or may have or more intervening layers. In operation, a voltage is applied across the LED stack such that the anode is positive with respect to the cathode. Current flows through the LED stack from the cathode to anode, as electrons are injected from the cathode 180 into the lowest unoccupied molecular orbital (LUMO) of the emission layer (EML) 150, while electrons are withdrawn toward the anode 110 from the highest occupied molecular orbital (HOMO) of the EML 150 (alternately described as hole injection into the HOMO of the EML 150). Recombination of electrons and holes in the EML 150 is accompanied by emission of radiation, the frequency of which dependent upon the band gap of the EML, or the difference in energy (eV) between the HOMO and LUMO.

Referring to FIG. 1, anodes 110 (e.g. 110R, 110G, 11B) may be formed on a display substrate 400, such as a TFT substrate, or substrate including redistribution lines. Anodes 110 may be formed of a variety of electrically conductive materials. In an embodiment, anode 710 is formed of indium-tin-oxide (ITO). For example, ITO may be formed by sputtering or thermal evaporation. In an embodiment, an array of anodes 110 is sputtered onto a display substrate and patterned using photolithography techniques in general, with a separate anode 110 formed in each LED 101 (e.g. 101R, 101G, 101B) of a an RGB pixel 100. Anodes 110 may also be reflective. For example, anodes may include ITO/silver/ITO stacks.

As shown, a HIL 120 is formed on the anodes 110. In accordance with embodiments, the HIL 120 may be a common layer shared by multiple subpixels within a pixel, and may be a common layer across multiple pixels. The HIL 120 facilitates the injection of positive charge (holes) from the anode 110 into the HTL 130. The HIL 120 may be formed of materials such as conductive polymer-based materials (e.g. poly thiophenes, poly anilines), combination of arylamine based hole transport host and electron accepting dopant (e.g. charge transfer salts), strongly electron accepting small organic molecules, metal oxides. The HIL 120 may be formed using techniques such as spin coating, ink jet printing, slot die coating, nozzle printing, contact printing, gravure printing, any solution printing technology, as well as thermal evaporation.

As shown, a HTL 130 is optionally formed on the HIL 120. In accordance with embodiments, the HTL 130 may be a common layer shared by multiple subpixels within a pixel, and may be a common layer across multiple pixels. The HTL 130 transports positive charge (holes) to the EML 150 and may optionally physically separate the HIL 120 from the EML 150. HTL 130 may be formed of electron rich organic small molecules such as arylamines, polyfluorene derivatives or organic polymer materials. For example, HTL 130 may be formed with other materials such as inorganic metal oxides or semiconductor nanoparticles or inorganic metal oxide or semiconductor sol-gel materials. The HTL 130 may be formed using techniques such as spin coating, ink jet printing, slot die coating, nozzle printing, contact printing, gravure printing, any solution printing technology, as well as thermal evaporation.

Each subpixel may include an optional prime layer 140 (e.g. 140R, 140G, 140B) and hole blocking layer (HBL) 160 (e.g. 160R, 160G, 160B) on opposite sides of an emission layer (EML) 150 (e.g. 150R, 150G, 150B). The prime layers 140 and HBLs 160 may reduce carrier leakage and confine excitons in the EML 150, resulting in higher efficiency. Furthermore, the prime layers 140 and HBLs 160 may broaden the recombination zone and facilitate a longer operational lifetime. EML may be any emissive material. In an embodiment EML 150 is an electroluminescent material. For example, EML 150 may be formed of an organic material. Alternatively, EML may be another emissive material, such as a matrix of quantum dots.

As shown, an electron injection layer (EIL) and electron transport layer (ETL), illustrated together as EIL/ETL 170 is optionally formed on the optional HBL 160. EIL/ETL 170 may be a common layer shared by multiple subpixels within a pixel and may be a common layer across multiple pixels. The ETL component may be a high electron mobility layer that transports negative charge (electrons) into the EML 150. ETL component may be formed of electron deficient organic small molecules (e.g. substituted benzimidazoles), inorganic metal oxides or semiconductor nanoparticles, inorganic metal oxide or semiconductor sol-gel materials, organometallic compounds, and organic polymers. The ETL component may be formed using techniques such as spin coating, ink jet printing, slot die coating, nozzle printing, contact printing, gravure printing, any solution printing technology, as well as thermal evaporation. The EIL component is formed on the optional ETL component. In accordance with embodiments, the EIL component may be a common layer shared by multiple subpixels within a pixel and may be a common layer across multiple pixels. The EIL component facilitates the injection of negative charge (electrons) from the cathode 180 into the ETL component. EIL component may be formed of alkali metal salts such as LiF, low work function metals such as Ca, Ba, and n-doped material (e.g. combination of electron transport material and electron donating material). In an embodiment, the EIL component is formed by thermal evaporation.

As shown, a cathode 180 (e.g. 180R, 180G, 180B) is formed on the EIL/ETL 170. Cathode 180 may be formed of a variety of electrically conductive materials, including transparent or semi-transparent materials. In accordance with some embodiments, separate cathodes 180R, 180G, 180B are formed for respective subpixels. In accordance with embodiments, the cathode 180 may be a common layer shared by multiple subpixels within a pixel and may be a common layer across multiple pixels. In either configuration, cathode 180 thickness may be different over different subpixels within the same pixel 100. In an embodiment, cathode 180 is formed of materials such as Ca/Mg, Sm/Au, Yb/Ag, Ca/Ag, Ba/Ag, and Sr/Ag. For example, in a double layer Ca/Mg the Ca layer has a low work-function for electron injection, whereas a Mg capping layer improves electrical conductance of the cathode 180. In an embodiment, cathode 180 is formed by thermal evaporation.

In an embodiment, a display pixel 100 includes a first subpixel (e.g. including LED 101R) emission layer (e.g. 150R) designed to emit a first wavelength spectrum (e.g. red), a second subpixel (e.g. including LED 101B) emission layer (e.g. 150B) designed to emit a second wavelength spectrum (e.g. blue) different from the first wavelength spectrum. In this specific example red and blue are provided, though these two subpixel colors are exemplary, and the provided relationships may exist between other subpixel colors. A first cathode 180R layer area on the first subpixel emission layer, and a second cathode 180B layer area on the second subpixel emission layer. In an embodiment, the second cathode 180B layer area is thicker than the first cathode 180R layer area. A similar distinction is also illustrated with cathode 180B layer area being thicker than the cathode 180G layer area, though they may also be the same thickness. In the embodiment illustrated, cathode 180G layer area is also thicker than cathode 180R layer area. Thus, cathode thickness may be independently controlled for each subpixel, and some subpixels may optionally share a common cathode thickness. In accordance with embodiments the cathode 180R, 180G, 180B layer areas may be separate (e.g. electrically separate) layers, or they may be portions of a common cathode layer (which may include multiple layers).

Figure 2A:
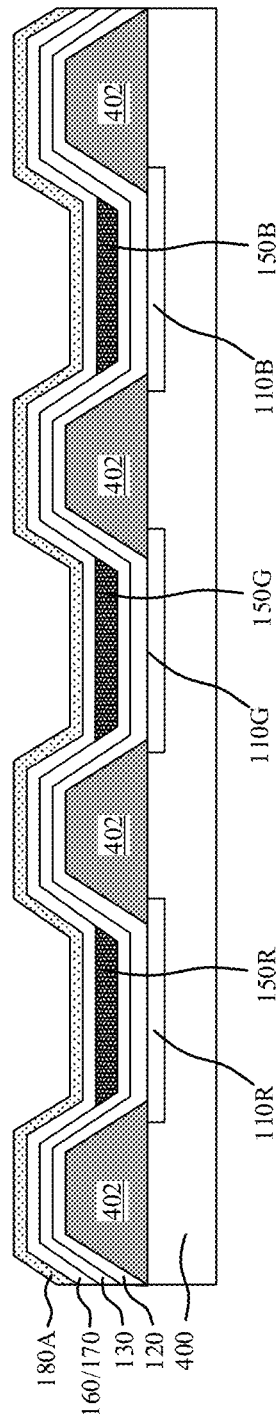
FIGS. 2A-2F are schematic cross-sectional side view illustrations for a method of forming a display pixel with a common cathode layer characterized by different thicknesses for respective subpixels in accordance with an embodiment.
Figure 2B:
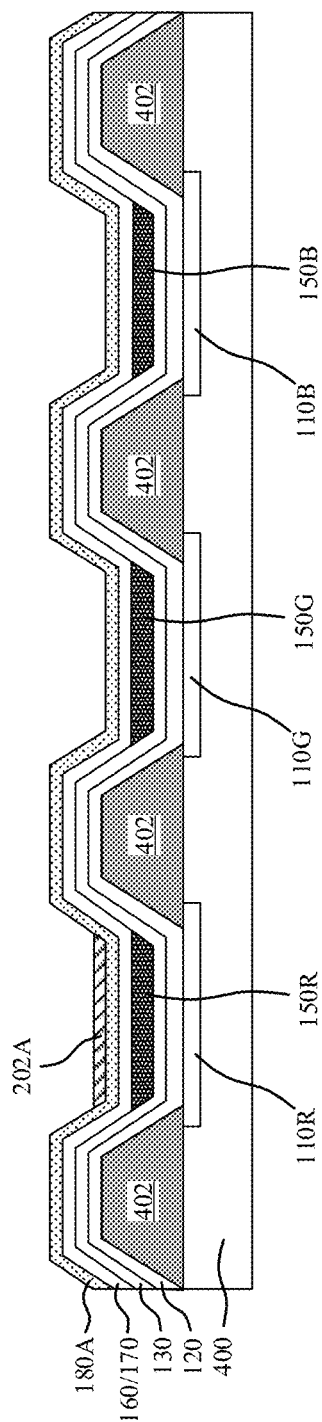
Figure 2C:
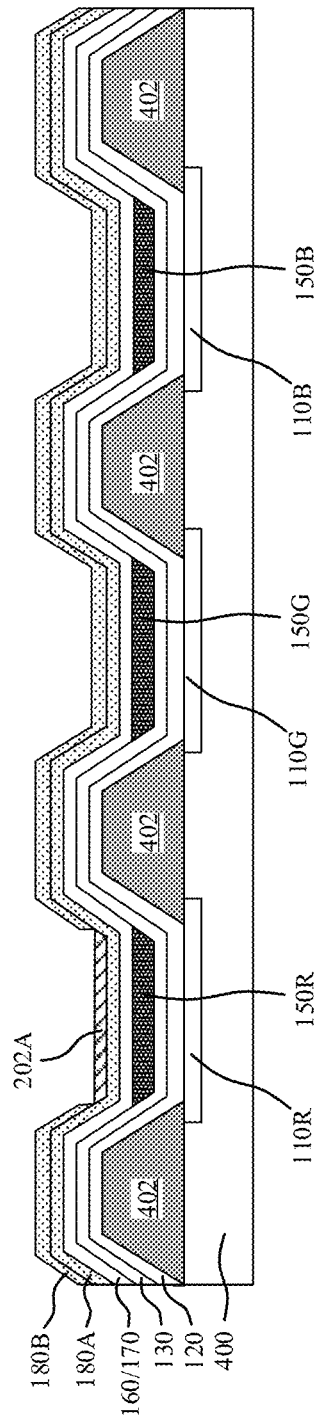

Referring now to FIGS. 2A-2F, schematic cross-sectional side view illustrations are provided for a method of forming a display pixel with a common cathode layer characterized by different thicknesses for respective subpixels in accordance with an embodiment. The fabrication sequence begins with FIG. 2A after the formation of a first cathode 180A layer, which is a common layer across all subpixels. A patterned organic layer 202A is then deposited over one or more EMLs using a fine metal mask (FMM), as illustrated in FIG. 2B. For example, the patterned organic layer 202A may be less than 10 nm thick. In an embodiment, the patterned organic layer 202A is deposited over the red emitting EML 150R. A second cathode 180B layer is then deposited as illustrated in FIG. 2C. As shown, the second cathode 180B layer may be a common layer deposited over subpixels not including the patterned organic layer 202A. Thus, an opening exists in the second cathode 180B layer over the patterned organic layer 202A.

Figure 2D:
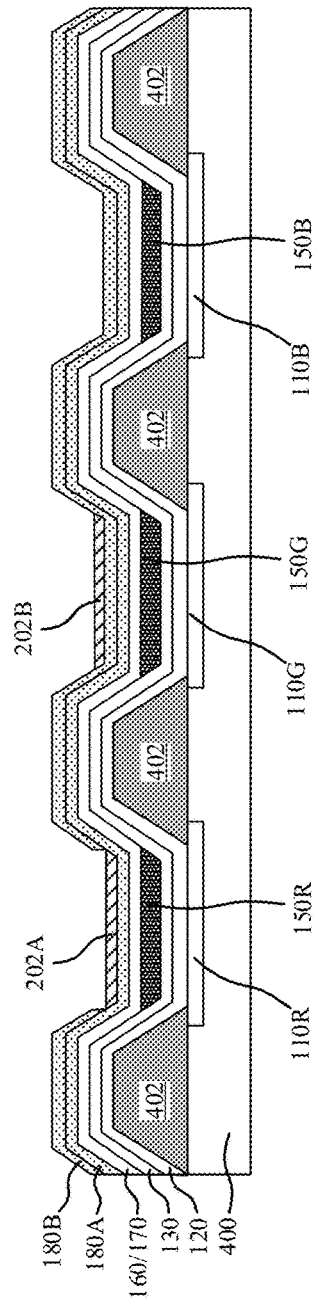
Figure 2E:
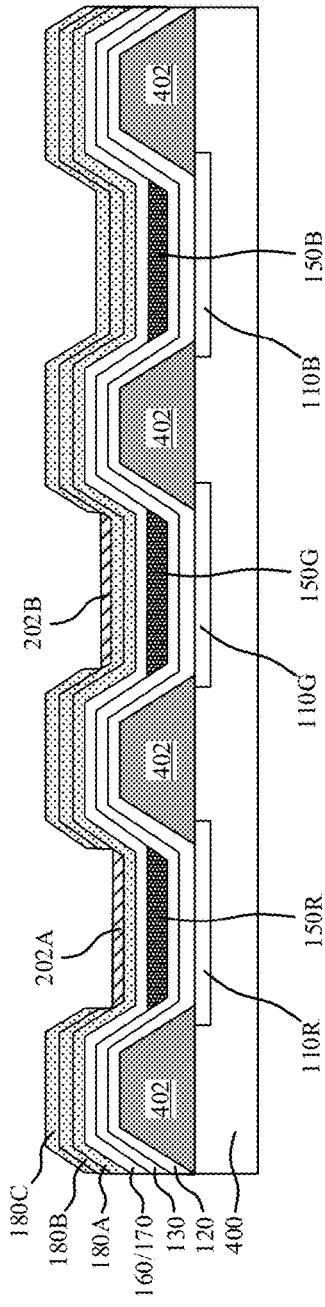

A second patterned organic layer 202B may then optionally be deposited over one or more EMLs using a fine metal mask (FMM), as illustrated in FIG. 2D. In the embodiment illustrated, the second patterned organic layer 202B is formed over a second EML (e.g. 150G) not including the first patterned organic layer 202A, and also including both cathode 180A, 180B layers. Referring now to FIG. 2E a third cathode 180C layer is then deposited over one or more subpixels not including a patterned organic layer 202A, 202B. The third cathode 180C layer may be a common layer, or specific to certain subpixels. In either case, the third cathode 180C layer may include openings such that it is not formed over the patterned organic layers 202A, 202B. In the particular embodiment illustrated, the third cathode 180C layer is formed over the blue emitting LED 101B. A common organic layer 202C may then be blanket deposited over all subpixels to provide encapsulation. Taken together organic layers 202A, 202B, 202C form a common organic layer 202. Each of the organic layers 202A, 202B, 202C may be formed of the same or different materials. Taken together cathode 180A, 180B, 180C layers form a common cathode 180 layer. Each of the cathode 180A, 180B, 180C layers may be formed of the same or different materials.

In an embodiment, the organic layer 202 is formed over he first cathode 180R layer area and the second cathode 180G layer area. The organic layer 202 is thicker over the first cathode 180R layer area than the second cathode 180B layer area.

It has been observed that in order to have larger chromaticity and higher efficiency, a strong optical cavity is implemented in a traditional active matrix organic light emitting diode (AMOLED) display. Yet, it has been observed that off-angle color shift occurs with the optical cavity. Thus, efficiency is met with a tradeoff of off-angle color shift. In accordance with embodiments cathode layer thickness is independently adjusted for each subpixel for color compensation. Rather than trying to achieve Lambertian emission from each subpixel the optical thickness of the cavities are adjusted to match the luminance distributions of the different subpixels relative to each other. Therefore, by matching the luminance distributions for each subpixel, white off-angle color shift can be reduced, providing better viewing angle performance while also increasing on-axis efficiency and lowering panel power. In particular, the optical cavity may create blue-shifted color at off angles. Accordingly, cathode thickness for the red emitting subpixels is kept the thinnest in some embodiments to have higher intensity at off-angles than blue and green subpixels to compensate for the optical cavity effect and achieve better viewing angle performance.

Figure 2F:
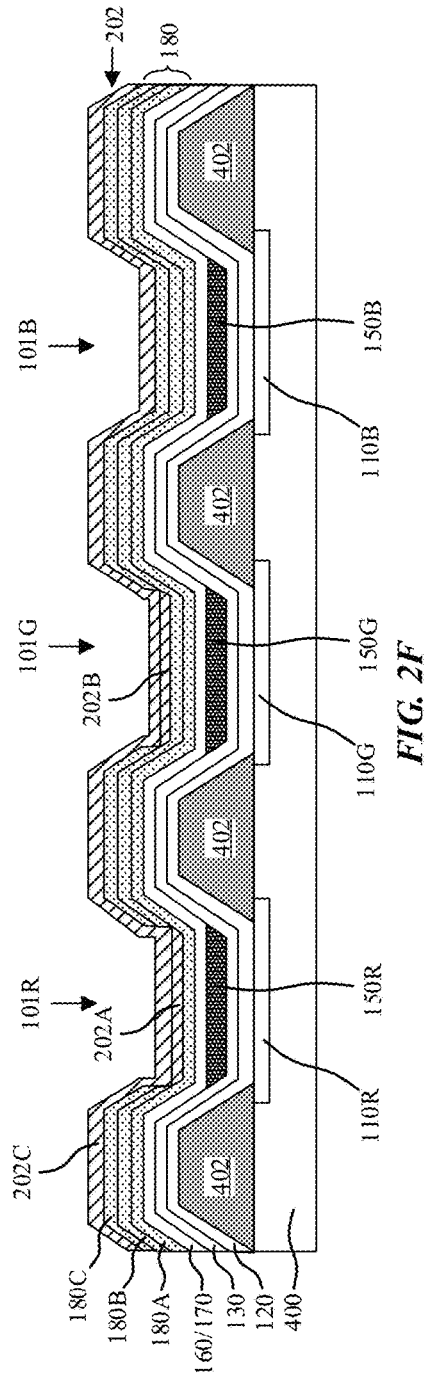

In order to verify the described relationship, simulation data was created for a series of pixels of the structures illustrated in FIGS. 1 and 2F. A baseline example was first provided for a pixel in which cathode thickness is kept uniform at 14 nm. Cathode thickness was then increased for independent supixels. White color shift (dE) at 60 degrees, and normalized panel power were then calculated for each example. The results are provided in Table 1.

TABLE 1

Pixel white color shift and panel power vs. cathode thickness

| Example | R/G/B cathode thickness (nm) | White dE @ 60 deg | Panel Power |
|---|---|---|---|
| Baseline | 14/14/14 | 12.7 | 100% |
| Example 1 | 14/16/16 | 9.7 | 98% |

TABLE 1-continued

Pixel white color shift and panel power vs. cathode thickness

| Example | R/G/B cathode thickness (nm) | White dE @ 60 deg | Panel Power |
|---|---|---|---|
| Example 2 | 14/18/18 | 7.9 | 97% |
| Example 3 | 16/20/20 | 6.3 | 95% |
| Example 4 | 14/20/18 | 9.2 | 95% |
| Example 5 | 14/18/20 | 9.1 | 96% |

As can be derived from the results provided in Table 1, in each Example, overall panel power was reduced relative to baseline by increasing cathode thickness. In additional white color shift at 60 degrees was reduced. Both individual subpixel color point shift and angular intensity contribute to white color shift. The results of Table 1 illustrate that individual subpixel cathode thicknesses can be adjusted to white color shift over angle, while also increasing efficiency. While an increase in thickness of red LED cathode thickness can result in a red point color shift, an increase in thickness of green and blue LED cathode thickness can result in angular intensity. Both individual color shifts and angular intensity can be adjusted with cathode thickness in order to match individual subpixel color points over viewing angle and resultingly the white color point.

A variety of different structures are described herein that may be implemented to improve angular performance. In interest of clarity, the different structures are described and illustrated separately. It is understood the many embodiments may be combined where appropriate.

Figure 3:
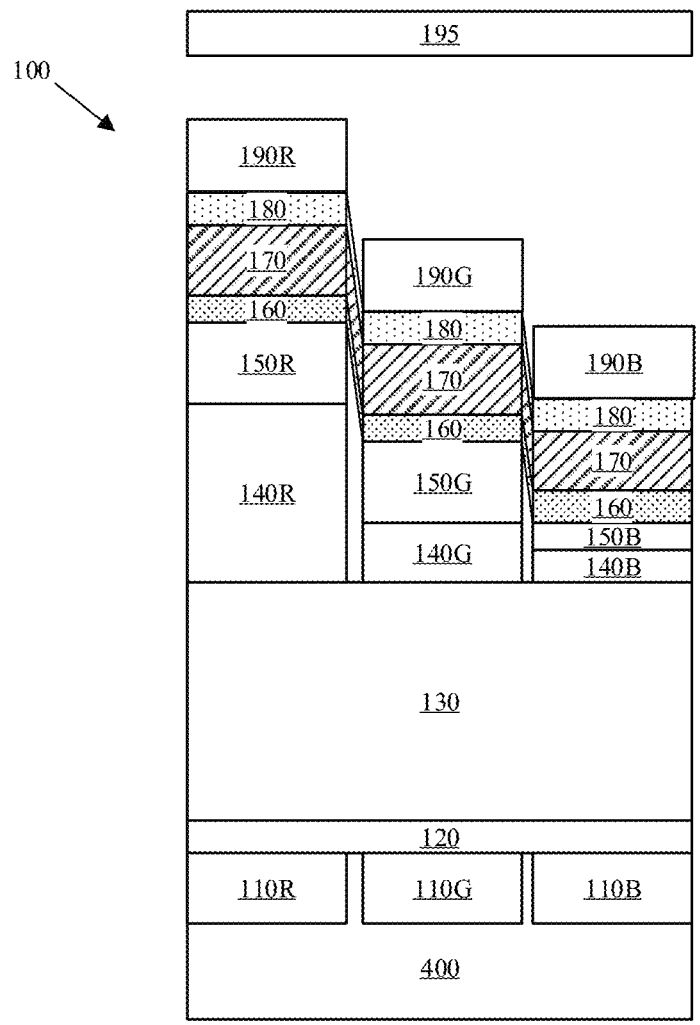
FIG. 3 is a schematic cross-sectional side view illustration of a display pixel with reflectors for respective subpixels in accordance with an embodiment.

Referring now to FIG. 3 a schematic cross-sectional side view illustration of a display pixel with reflectors for respective subpixels in accordance with an embodiment. The configuration illustrated in FIG. 3 may be utilized to achieve the same cavity effects described above with regard to FIGS. 1-2F, and may be combined. The illustration in FIG. 3 is similar to that provided in FIG. 1 with one difference being that FIG. 3 is an extended cavity method, in which individual reflectors 190R, 190G, 190B may be independently placed over the cathode layer(s) to adjust the cavity effect. A top encapsulation layer 195 is also illustrated.

Figure 4A:
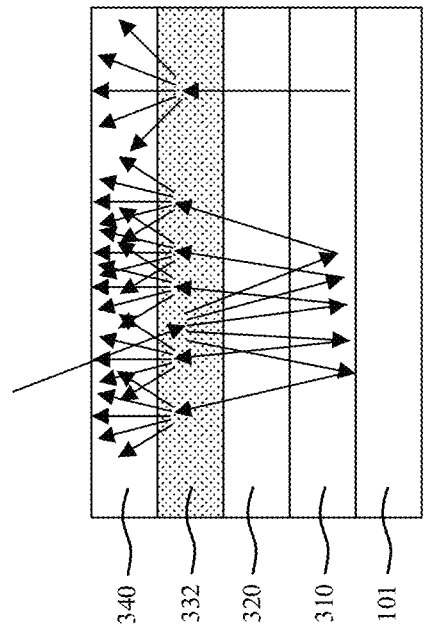
FIG. 4A is a schematic cross-sectional side view illustration of a display structure including a polarization sensitive diffuser over a quarterwave film in accordance with an embodiment.

FIG. 4A is a schematic cross-sectional side view illustration of a display structure including a polarization sensitive diffuser over a quarterwave film in accordance with an embodiment. Generally, the structure includes an LED 101 as previously described, a compensation film 310 over the LED 101, a quarterwave film 320 over the compensation film 310, a polarization sensitive diffuser 330 over the quarterwave film 320, and a linear polarizer film 340 over the polarization sensitive diffuser 330. Together the linear polarizer film 340 and quarterwave film 320 form a circular polarizer. Thus, the stackups including the polarization sensitive diffuser 330 in accordance with embodiments may be modifications of a traditional circular polarizer stackup.

In one aspect, integration of the polarization sensitive diffuser 330 may improve viewing angle by scattering light emitted from the LED 101, while suppressing diffusion and reflection of ambient light. The polarization sensitive diffuser 330 in accordance with embodiments is designed to be transparent to specific polarizations of light, and potentially handedness as well. Since light emitted from the LED 101 is not polarized, this light is scattered by the polarization sensitive diffuser 330. The display structures including the polarization sensitive diffuser may be considered high haze, high clarity in some embodiments.

Still referring to FIG. 4A the compensation film 310 illustrated may optionally be included to provide better reflection color by shifting the reflected wavelength. The quarterwave film 320 shifts the wavelength phase by 45 degrees. The linear polarizer film 340 is a transparent material such a polyvinyl alcohol (PVA) though a variety of other materials may be used. As shown, ambient light enters the stackup. The linear polarizer converts the unpolarized ambient light to linearly polarized light. The polarization sensitive diffuser 330 is designed to transmit the linearly polarized light. The polarization sensitive diffuser 330 may include liquid crystals dispersed in an isotropic film in embodiments. Initially, randomly polarized ambient light enters the display panel and the linear polarizer film 340 transmits a specified amount of polarized light in the parallel and perpendicular directions. The linearly polarized light is passed by the polarization sensitive diffuser 330. The transmitted light is then shifted a quarter wavelength by the quarterwave film 320 where the linearly polarized light is converted to circular polarized light, and then reflected in the backplane (reflection is shown at the LED 101). The reflected light may be shifted in handedness, and transmitted back through the quarterwave film 320, where the light is again shifted another quarter wavelength. Both ambient light reflected from underneath the polarization sensitive diffuser 330 (which is now circularly polarized) and light emitted from the LED 101 are scattered by the polarization sensitive diffuser 330. Thus, the polarization sensitive diffuser will transmit the linearly polarized light and scatter the circularly polarized reflected light.

Figure 4B:
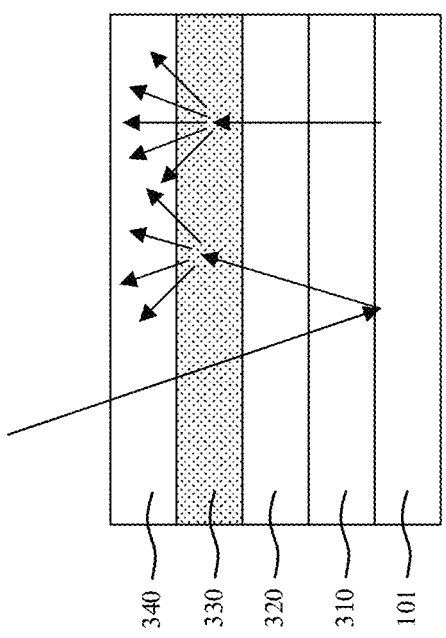
FIG. 4B is a schematic cross-sectional side view illustration of a display structure without a polarization sensitive diffuser.

In order to illustrate the effect of being polarization dependent a comparable structure illustrated in FIG. 4B, where the polarization sensitive diffuser 330 is replaced with a diffuser layer 332 that is not polarization sensitive. As shown, incoming linearly polarized light is scattered by the diffuser layer 332 rather than passing through. As result, reflection performance is reduced.

Figure 5:
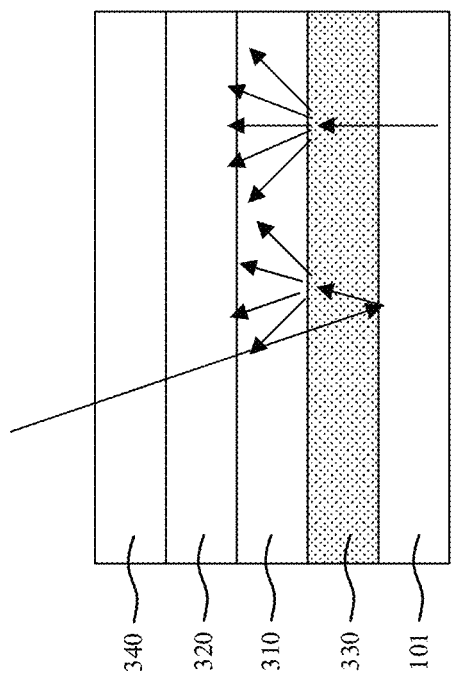
FIG. 5 is a schematic cross-sectional side view illustration of a display structure including a polarization sensitive diffuser underneath a quarterwave film in accordance with an embodiment.

A number of configurations are possible for integrating a polarization sensitive diffuser 330. FIG. 5 is a schematic cross-sectional side view illustration of a display structure including a polarization sensitive diffuser underneath a quarterwave film in accordance with an embodiment. FIG. 5 is similar to FIG. 4A, but with the quarterwave film 320 over the optional compensation film 310, which is over the polarization sensitive diffuser 330. In this case, the polarization sensitive diffuser passes the polarized light. As shown, ambient unpolarized light is converted to linearly polarized light with the linear polarizer film 340. The quarterwave film 320 then converts the linearly polarized light to circularly polarized light. Subsequent reflection then changes the handedness of the circularly polarized light. The polarization sensitive diffuser 330 is selective to the specific handedness of this circularly polarized light, and now scatters the light. Thus, the polarization sensitive diffuser 330 is selective to both the circularly polarized light, as well as the specific handedness for scattering purpose.

Figure 6:
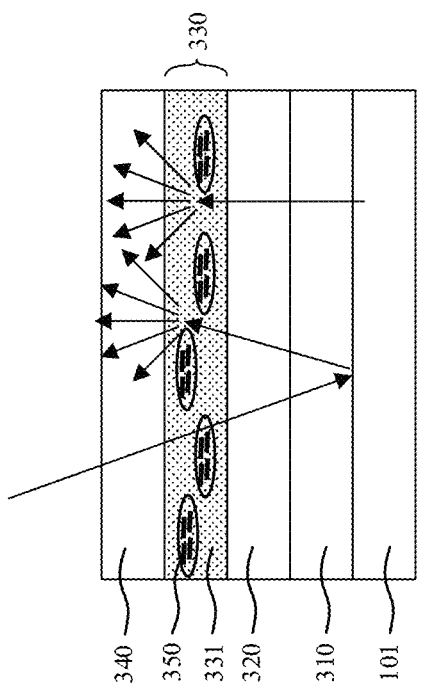
FIG. 6 is a schematic cross-sectional side view illustration of a display structure including a polarization sensitive diffuser with a rough liquid crystal polymer film in accordance with an embodiment.

FIG. 6 is a schematic cross-sectional side view illustration of a display structure including a polarization sensitive diffuser with a rough liquid crystal polymer film in accordance with an embodiment. FIG. 6 is similar to FIG. 4A, with one difference being the composition of the quarterwave film polarization sensitive diffuser 330. In the particular embodiment illustrated in FIG. 6, the quarterwave film includes a lower liquid crystal polymer film 334 underneath an isotropic film 331. The liquid crystal polymer film includes a top surface 335 that is characterized by a higher average surface roughness than a top surface 333 of the isotropic film 331. In order to fabricate the layer stack, the liquid crystal polymer film is first deposited, and optionally partially cured. A mold or stamp may be utilized to create the surface roughness followed by curing. The isotropic film 331 may then be applied. In this configuration, it is the surface roughness contributes to scattering of light. Specifically, the linearly polarized light initially passing through the polarization sensitive diffuser 330 passes through materials in the isotropic film 331 and liquid crystal polymer film 334 with matched ordinary refractive indices. However, the isotropic film 331 and liquid crystal polymer film 334 has different extraordinary refractive indices to the reflected polarized light, which contributes to scattering at the rough interface between the isotropic film 331 and liquid crystal polymer film 334.

Figure 7:
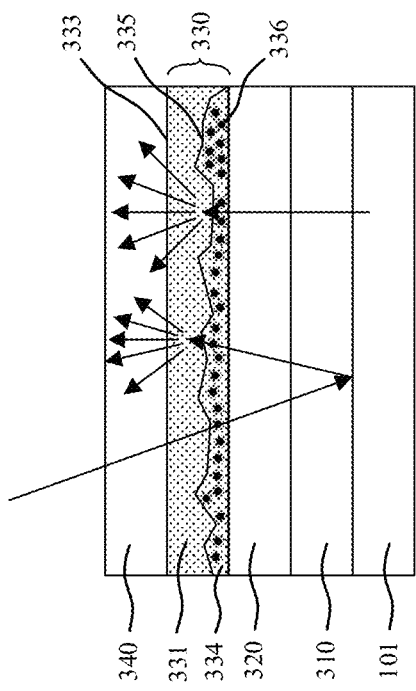
FIG. 7 is a schematic cross-sectional side view illustration of a display structure including a polarization sensitive diffuser with embedded liquid crystals in accordance with an embodiment.

FIG. 7 is a schematic cross-sectional side view illustration of a display structure including a polarization sensitive diffuser with embedded liquid crystals in accordance with an embodiment. FIG. 7 is similar to FIG. 4A, with one difference being the composition of the quartcrwavc film polarization sensitive diffuser 330. In the particular embodiment illustrated in FIG. 7, the quartcrwavc film polarization sensitive diffuser includes phase separated nematic liquid crystals (NLC) 350 dispersed an isotropic film 331. In fabrication, the phase separated NLCs may be droplets within the stretched isotropic polymer to align the droplets. In this configuration, the refractive index mismatch between the droplets and the isotropic film contributes to the scattering.

Figure 8:
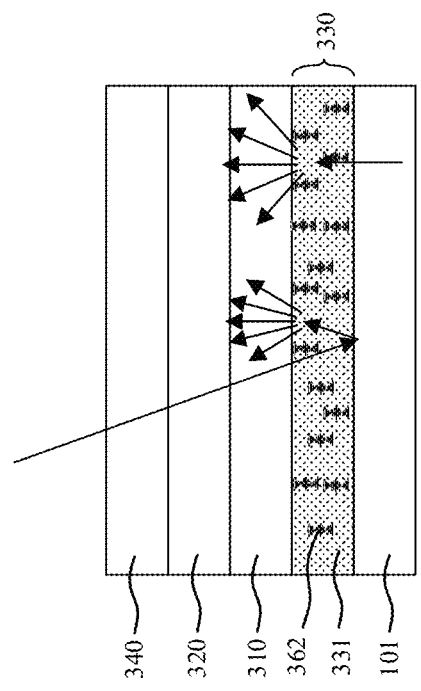
FIG. 8 is a schematic cross-sectional side view illustration of a display structure including a polarization sensitive diffuser with a rough liquid crystal polymer film in accordance with an embodiment.

FIG. 8 is a schematic cross-sectional side view illustration of a display structure including a polarization sensitive diffuser with a rough liquid crystal polymer film in accordance with an embodiment. FIG. 8 is similar to FIG. 5, with one difference being the composition of the quartcrwavc film polarization sensitive diffuser 330. In the particular embodiment illustrated in FIG. 8, the quarterwave film includes a lower liquid crystal polymer film 360 underneath an isotropic film 331. The lower liquid crystal polymer film 360 includes phase separated cholesteric liquid crystals (CLC) 350, which can include a chiral dopant.

Figure 9:
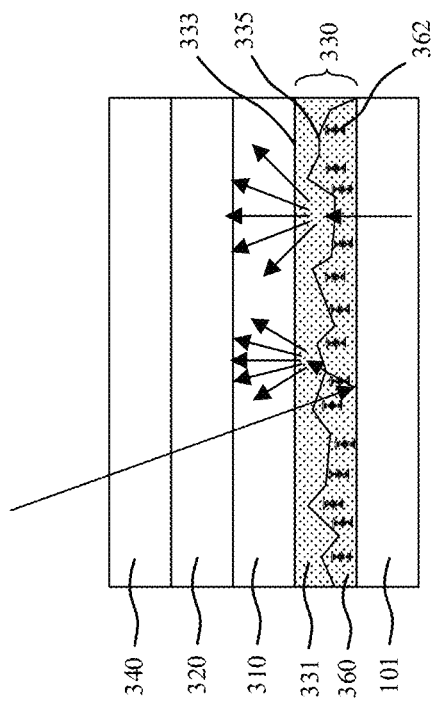
FIG. 9 is a schematic cross-sectional side view illustration of a display structure including a polarization sensitive diffuser with embedded liquid crystals in accordance with an embodiment.

FIG. 9 is a schematic cross-sectional side view illustration of a display structure including a polarization sensitive diffuser with embedded liquid crystals in accordance with an embodiment. FIG. 8 is similar to FIG. 5, with one difference being the quartcrwavc film polarization sensitive diffuser 330 includes phase separated cholesteric liquid crystals (CLC) 350 dispersed an isotropic film 331, with the CLCs are contained with in within droplets mixed with the isotropic film 331.

Figure 11:
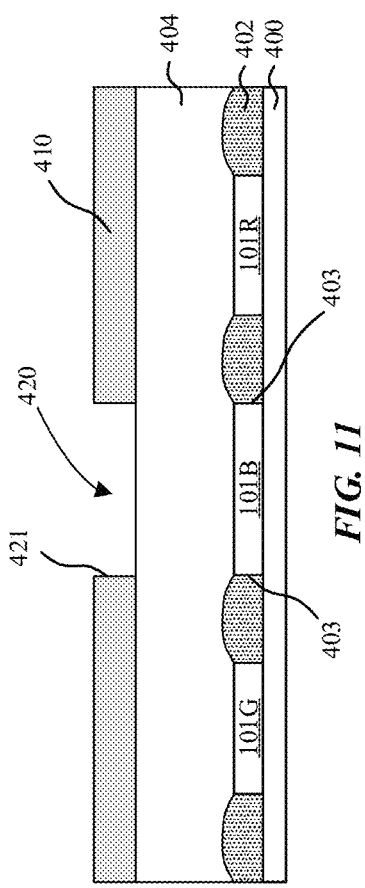
FIG. 11 is a schematic cross-sectional side view illustration of a filtermask over a plurality of subpixels in accordance with an embodiment.
Figure 12:
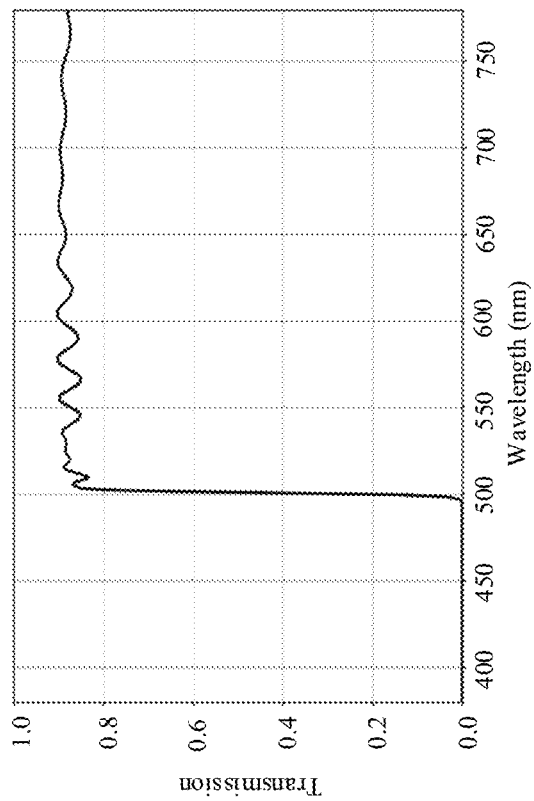
FIG. 12 is a transmission plot for a longpass filtermask in accordance with an embodiment.
Figure 10:
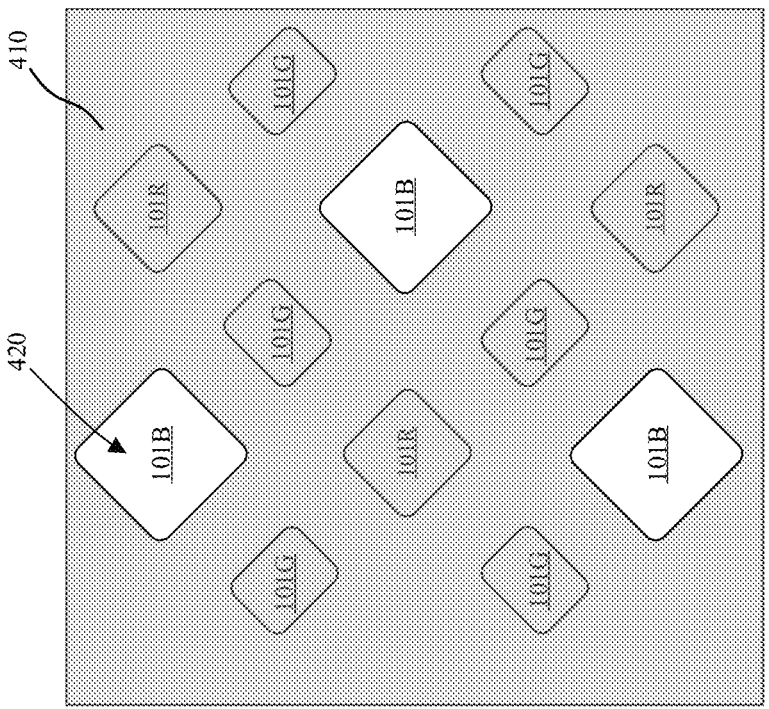
FIG. 10 is a schematic top view illustration of a filtermask over a plurality of subpixels in accordance with an embodiment.

Referring now to FIGS. 10-11 a schematic top view and cross-sectional side view illustrations of a filtermask over a plurality of subpixels are provided in accordance with an embodiment. Similar to the use of cathode thickness and dielectric reflector, filtermasks can be used in accordance with embodiments to provide additional control of off-angle color and luminance. Luminance has a dependence on the viewing angle partly due to the microcavity effect and partially due to the optical pass through the other layers stacked on top of the LED. The luminance drop with viewing angle is different between red, green, blue subpixels. Color shift due to micro cavity can be mitigated by adding color filters on top of each LED. However, viewing angle luminance drop difference between subpixels remains, which can lead to a perceivable viewing angle color shift. In accordance with embodiments, luminance drop can be independently controlled for each subpixel by using a filtermask to serve as an aperture for optical obstruction, changing the luminance drop of one subpixel at a time. Thus, use of filtermasks can be used to match the luminance distributions for each subpixel, allowing for a reduction in white off-angle color shift and providing better viewing angle performance. The filtermasks can be wavelength selective absorbers, such as a longpass filter in many embodiments. Other options include a black matrix material, and shortpass filter (also a wavelength selective absorber). Multilayer structures can include combinations thereof.

As shown in FIGS. 10-14 in an embodiment, a display pixel includes a substrate 400, and a plurality of LEDs 101 (e.g. 101G, 101B, 101R). In an embodiment of an OLED display, a pixel defining layer (PDL) 402 may be used to define contact area with the underlying anodes, and hence size of the LEDs 101G, 101B, 101R. A passivation layer 404 may be formed over the LEDs. In the embodiment illustrated a filtermask 410 is formed over the passivation layer 404, with an aperture 420 over the blue LED 101B. Aperture 420 may have inside edges 421. As illustrated, the filtermask 410 may completely cover the red and green LEDs. Thus, the filtermask 410 may be considered a fully obstructing mask. In an embodiment, the filtermask 410 may be directly over outer edges 403 of LED 101B active area. For example, these may be defined by the PDL 402. Thus, the aperture 420 may be smaller than the opening in the PDL 402 defining the active LED pixel area in an embodiment. In a particular embodiment, the filtermask is a longpass filter. For example, the exemplary transmission plot of FIG. 13 illustrates transmission for a longpass filter where wavelengths below approximately 500 nm are absorbed, and wavelengths above approximately 500 nm are transmitted. Thus, blue light is absorbed, while red and green light is transmitted.

Figure 19:
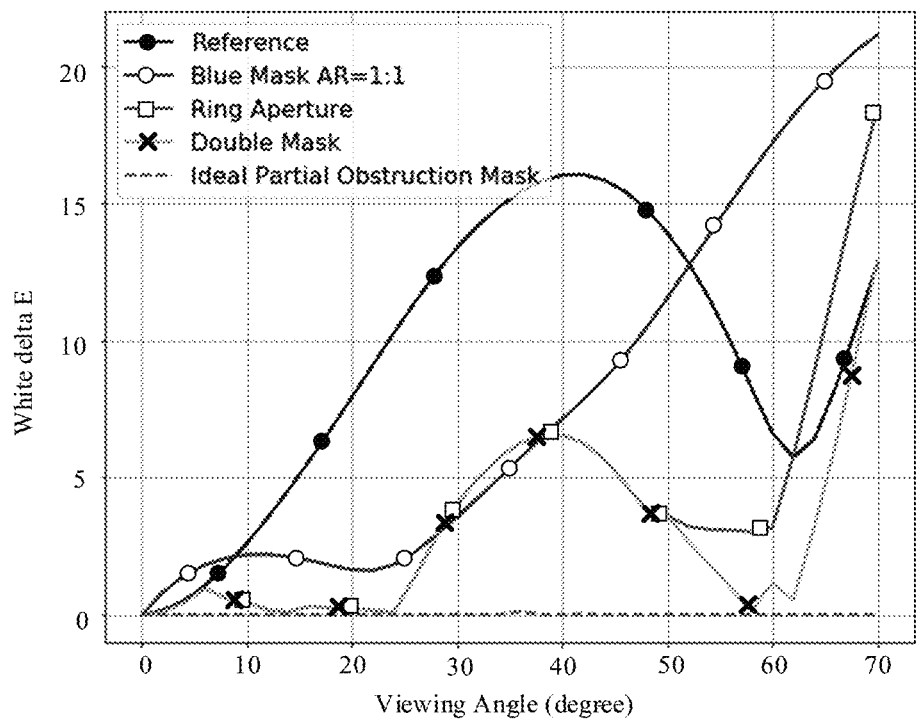
FIG. 19 includes a plot of white color shift over viewing angle for a variety of filtermask embodiments, FIG. 20 includes a plot of color space diagram for the embodiments and viewing angles of FIG. 19 in accordance with embodiments.
Figure 20:
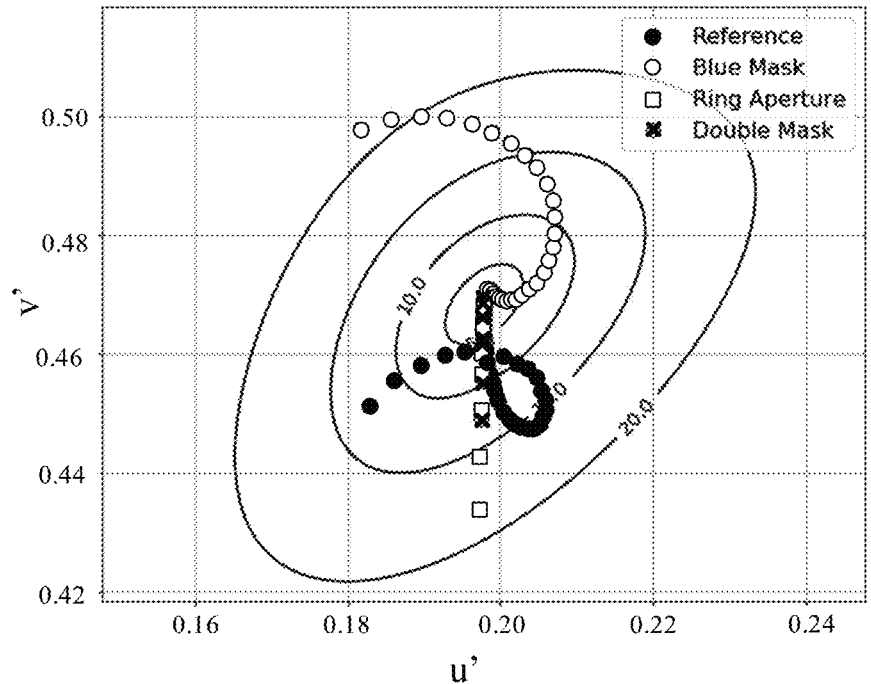

Referring now briefly to FIGS. 19-20, FIG. 19 includes a plot of white color shift over viewing angle for a variety of filtermask (obstruction mask) embodiments described herein, while FIG. 20 includes a plot of color space diagram for the embodiments and viewing angles of FIG. 19 in accordance with embodiments. As shown, the simulation data suggests the configuration of FIGS. 10-11 (corresponding to the Blue Mask) for adjusting the luminance drop of even one subpixel (e.g. blue) can improve (reduce) the viewing angle color shift. In this case, the blue viewing angle luminance can be adjusted to match that of the red and green subpixels to reduce white viewing angle color shift.

Referring now to FIGS. 13-15, schematic top, cross-sectional side view, and isometric view illustrations are provided for an implementation of a ring shaped filtermask over a subpixel in accordance with an embodiment. Unlike the fully obstructing mask of FIGS. 10-11, the ring shaped filtermask 412 of FIGS. 13-15 does not necessarily cover the LEDs of other subpixels. As illustrated in FIG. 16, this can have the affect of increasing overall luminance over viewing angles compared to the fully obstructing mask of FIGS. 10-11. In an embodiment, the ring shaped filtermask 412 may be directly over outer edges 403 of LED 101B active area. For example, these may be defined by the PDL 402. Thus, the aperture 420 may be smaller than the opening in the PDL 402 defining the active LED pixel area in an embodiment. Of particular interest, simulation data of FIGS. 19-20 suggests a ring shaped filtermask 412 (corresponding to Ring Aperture) can further improve (reduce) viewing angle color shift, and additionally allow for control of off-angle color bias. In the particular embodiments illustrated blue luminance is dominant at off-angles, so the embodiments are directed toward obstructing blue light at off-angles. Selection of a ring shaped filtermask 412 structure provides an additional degree of freedom for control of luminance at specific angles. As a result, the type of color shift can be controlled, such as red-shift, blue-shift etc. Simulation data of FIG. 20 indicates control to a specific color direction (in particular a blue direction, as opposed to red) can be achieved with the ring shaped filtermask 412. This provides an additional degree of control.

In an embodiment, a display pixel includes a first LED (e.g. 101B), a second LED (e.g. 101R), a passivation layer 404 over the first LED and the second LED, and a filtermask over the passivation layer, where the filtermask 412 is ring shaped and includes an aperture 420 over the first LED (e.g. 101B). Shape of the ring shaped filtermask can be adjusted to control off-angle emission intensity and color bias. In an embodiment, the ring shaped filtermask 412 includes an outer perimeter characterized by a contour such as oval and rectangular. In an embodiment, the outer perimeter is characterized by a same shape as the aperture. In other configurations the outer perimeter and aperture shapes have different shapes to aid in control of off-angle emission intensity and color bias.

Figure 17:
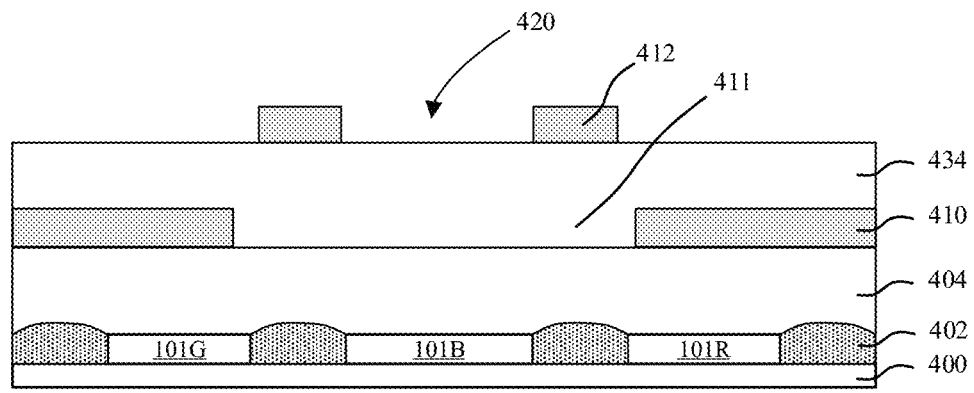
FIG. 17 is a schematic cross-sectional side view illustration of a double filtermask over a subpixel in accordance with an embodiment.

Combinations of filtermask structures are possible. FIG. 17 is a schematic cross-sectional side view illustration of a double filtermask over a subpixel in accordance with an embodiment. As shown a second filtermask 410 (e.g. a fully obstructing filter mask similar to FIGS. 10-11) can be formed on the passivation layer 404, with a second passivation layer 434 formed over the second filtermask 410. In an embodiment, the second filtermask 410 includes a second aperture 411 over the first LED (e.g. 101B) and completely covers the second LED (e.g. 101R, and 101G). The second passivation layer 434 ay fill the second aperture 411. Alternatively, a different filtermask can be formed in the second aperture 411. In an embodiment, the second aperture 411 (of the fully obstructing filtermask) is wider than the first aperture 420 (of the ring shaped filtermask). In an embodiment, both filtermask layers are longpass filters, and may pass a same spectrum. Vertical spacing between the ring shaped filtermask 412 and the second filtermask 410 may open a gap to pass light unobstructed from LED 101B at specified high angles. This approach allows for a fine tuning of the angular luminance distribution where the luminance of an LED can be adjusted from 0% to 100% as a function of angle.

Figure 18:
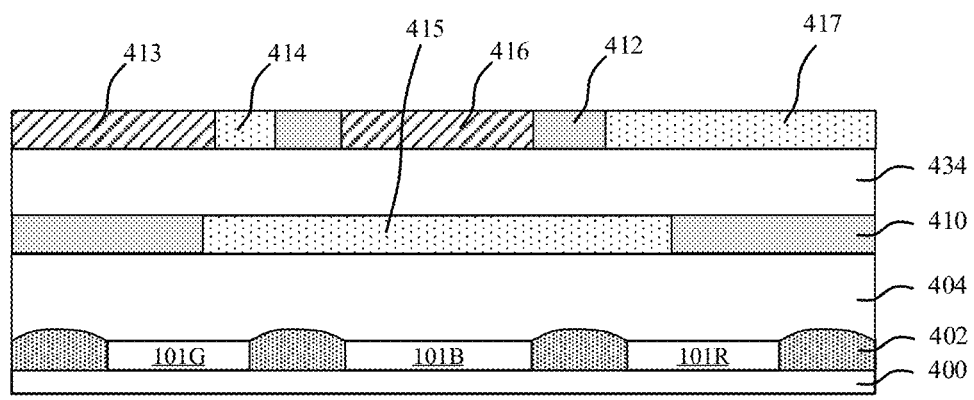
FIG. 18 is a schematic cross-sectional side view illustration of a multi-level filtermask over a subpixel in accordance with an embodiment.

FIG. 18 is a schematic cross-sectional side view illustration of a multi-level filtermask over a subpixel in accordance with an embodiment. In the same fashion as the ring shaped filtermask 412 and the second filtermask 410 tune the angular luminance of LED 101B, additional filtermasks can be interleaved to tune the neighboring pixels. In the particular embodiment illustrated in FIG. 18, the filtermask 415, filtermask 414, and filtermask 417 are bandpass filters blocking the emission from the LED 101G; the filtermask 413 and filtermask 416 are bandpass filters blocking the emission from the LED 101R. An ideal filtermask is an optimal configuration of such interleaved mask set simultaneously adjusts the angular luminance of all pixels independently to maintain the white color point across all angles as shown in FIG. 19.

Figure 21:
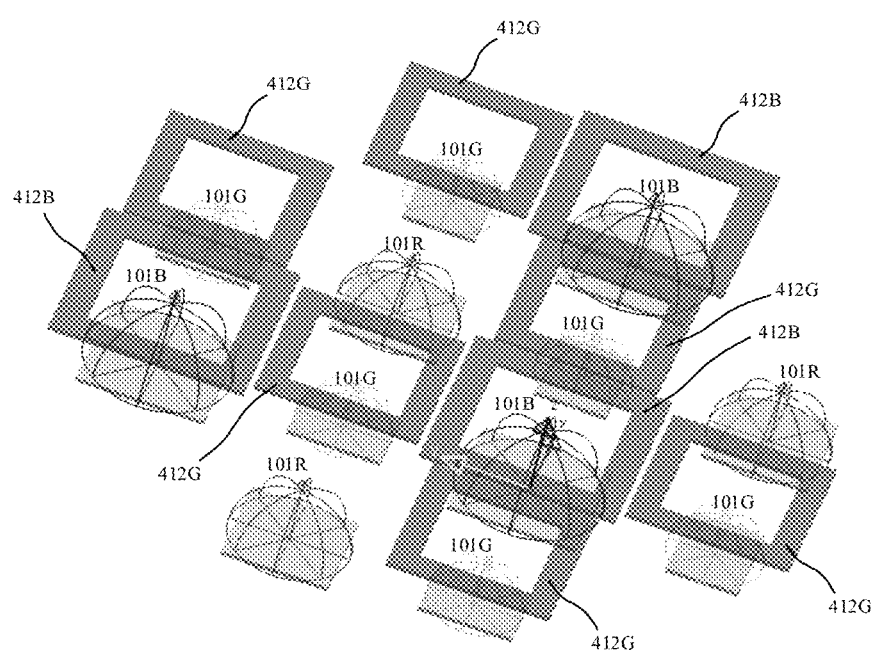
FIG. 21 is an isometric view illustration of an embodiment with multiple ring shaped filtermasks over multiple LEDs.

Referring now to FIG. 21 an isometric view illustration is provided of an embodiment with multiple ring shaped filtermasks over multiple LEDs. As shown, ring shaped filtermasks 412G are provided over the green emitting LEDs 101G, while ring shaped filtermasks 412B are provided over the blue emitting LEDs 101B. This can also be extended to red emitting LEDs, etc.

Figure 22:
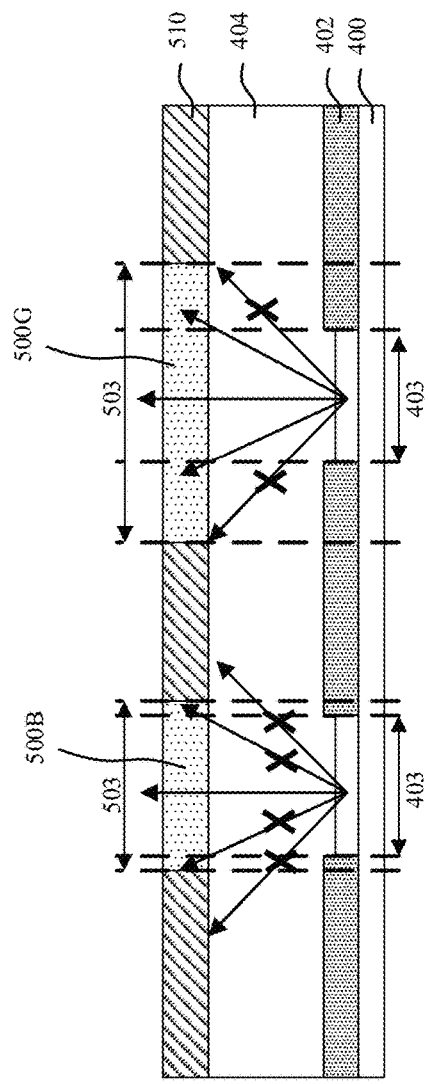
FIG. 22 is a schematic cross-sectional side view illustration of a display pixel including a color filter in accordance with an embodiment.

Angular intensity and white angular color shift can also be controlled with a color filter configuration in accordance with embodiments. FIG. 22 is a schematic cross-sectional side view illustration of a display pixel including a color filter in accordance with an embodiment. In an embodiment, a display pixel includes a pixel defining layer (PDL) 402 including a first subpixel opening and a second subpixel opening corresponding to outer edges 403 of the LED active areas. A passivation layer 404 is formed over the PDL 402, and a filtermask 510 is formed over the passivation layer 404. The filtermask 510 includes a first aperture 503 over the first subpixel opening corresponding to outer edges 403 of the LED active area, and a second aperture over the second subpixel opening corresponding to outer edges 403 of the LED active area. The filtermask 510 may be either of the filtermasks 410, 412 previously described. As illustrated, the first aperture 503 is wider than the first subpixel opening by a first minimum gap, and the second aperture 503 is wider than the second subpixel opening by a second minimum gap, with the second minimum gap distance being greater than the first minimum gap distance. A first color filter 500 may be located adjacent (e.g. within) the first aperture, and a second color filter 500 may be located adjacent (e.g. within) the second aperture.

Figure 23:
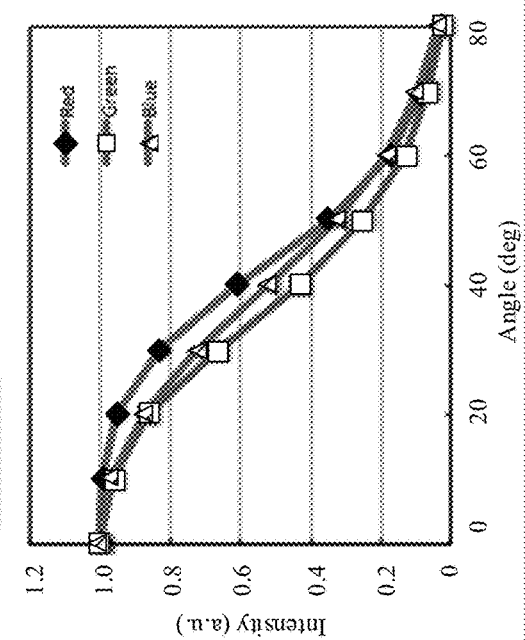
FIG. 23 is a plot of angular intensity over viewing angle without a color filter.
Figure 24:
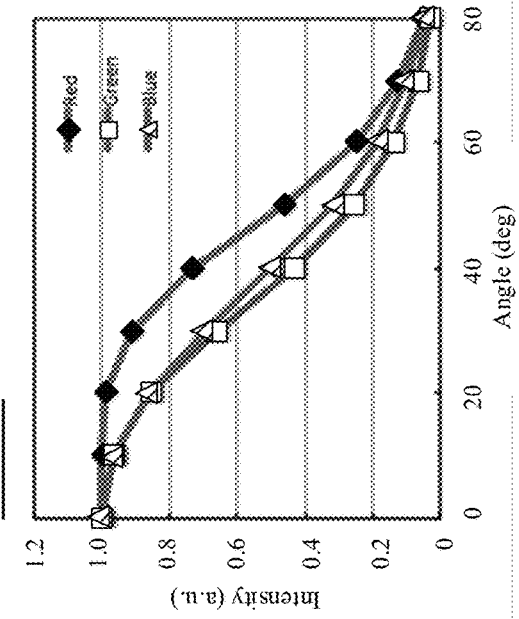
FIG. 24 is a plot of angular intensity over viewing angle with a color filter in accordance with embodiments.

FIG. 23 is a plot of angular intensity over viewing angle without a color filter. FIG. 24 is a plot of angular intensity over viewing angle with a color filter in accordance with embodiments. As shown, the simulation data shows that adjusting the relative sizes of the apertures and subpixel openings for respective subpixels can achieve better matching of intensity over viewing angle, and accordingly a reduction in white angular color shift.

Figure 25:
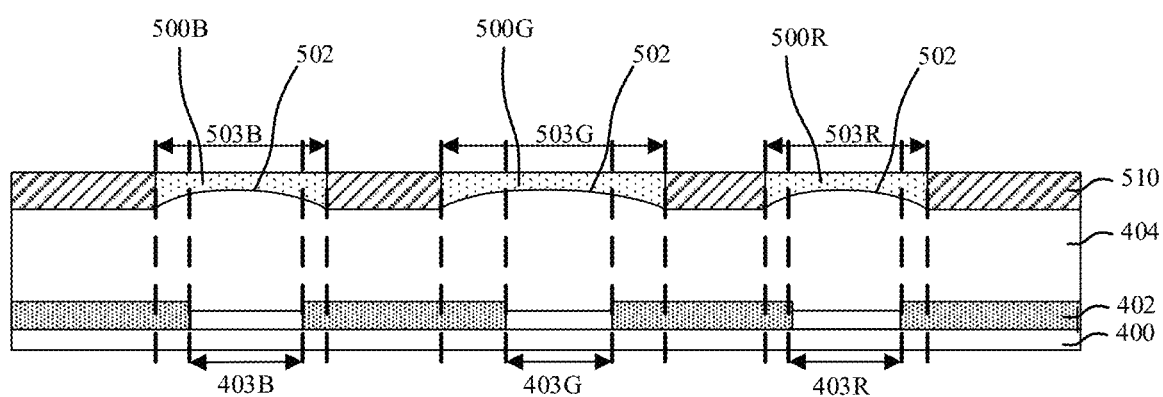
FIG. 25 is a schematic cross-sectional side view illustration of a display pixel including a color filter with a concave bottom surface in accordance with an embodiment.

FIG. 25 is a schematic cross-sectional side view illustration of a display pixel including a color filter with a concave bottom surface in accordance with an embodiment. As shown each of the color filters 50R, 500G, 500B includes a concave bottom surface 502, which can be implemented to further tune angular intensity behavior and white angular color shift where emission at larger angles can be reduced due to a thicker optical path.

In utilizing the various aspects of the embodiments, it would become apparent to one skilled in the art that combinations or variations of the above embodiments are possible for controlling viewing angle color shift. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A display structure comprising:
    a backplane including an emissive light emitting diode (LED);
    a polarization sensitive diffuser layer over the LED;
    a quarterwave film adjacent the polarization sensitive diffuser; and
    a linear polarization film over the polarization sensitive diffuser layer and the quarterwave film;
    wherein the polarization sensitive diffuser is designed to preferentially transmit linearly polarized light entering the polarization sensitive diffuser from the linear polarization film rather than scattering the linearly polarized light, and to scatter circularly polarized light reflected from the backplane.

2. The display structure of claim 1, wherein the quarterwave film is over the polarization sensitive diffuser layer.

3. The display structure of claim 1, wherein the quarterwave film is underneath the polarization sensitive diffuser layer.

4. The display structure of claim 1, wherein the polarization sensitive diffuser layer comprises a liquid crystal polymer film underneath an isotropic film, wherein the liquid crystal polymer film includes a top surface characterized by a higher average surface roughness than a top surface of the isotropic film.

5. The display structure of claim 1, wherein the polarization sensitive diffuser layer comprises liquid crystals dispersed in an isotropic film.

6. The display structure of claim 5, wherein the liquid crystals are phase separated nematic liquid crystals dispersed in the isotropic film.

7. The display structure of claim 6, wherein the phase separated nematic liquid crystals are droplets within a stretched isotropic polymer of the isotropic film.

8. The display structure of claim 1, wherein the polarization sensitive diffuser is selective to scattering a specific handedness of the circularly polarized light reflected from the backplane.

9. The display structure of claim 1, wherein the polarization sensitive diffuser is designed to scatter light emitted from the emissive LED.

10. The display structure of claim 9, wherein the quarterwave film is underneath the polarization sensitive diffuser layer.

11. The display structure of claim 10, further comprising a compensation film underneath the quarterwave film, wherein the compensation film is designed to shift a wavelength phase of the circularly polarized light reflected from the backplane.

12. The display structure of claim 10, wherein the polarization sensitive diffuser layer comprises liquid crystals dispersed in an isotropic film.

13. The display structure of claim 12, wherein the liquid crystals are phase separated nematic liquid crystals dispersed in the isotropic film.

14. The display structure of claim 13, wherein the phase separated nematic liquid crystals are droplets within a stretched isotropic polymer of the isotropic film.

15. The display structure of claim 1, wherein the LED is an organic light emitting diode (OLED).

* * * * *